US012425005B2

(12) United States Patent
Nagulapalli et al.

(10) Patent No.: US 12,425,005 B2
(45) Date of Patent: Sep. 23, 2025

(54) CLOCK DISTRIBUTION JITTER REDUCTION SYSTEMS AND METHODS

(71) Applicant: Analog Devices International Unlimited Company, Limerick (IE)

(72) Inventors: Rajasekhar Nagulapalli, County Limerick (IE); Wuttichai Lerdsitsomboon, County Limerick (IE); Haichen Liu, County Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 26 days.

(21) Appl. No.: 18/599,861

(22) Filed: Mar. 8, 2024

(65) Prior Publication Data

US 2024/0339989 A1    Oct. 10, 2024

Related U.S. Application Data

(60) Provisional application No. 63/456,993, filed on Apr. 4, 2023.

(51) Int. Cl.
*H03K 3/013* (2006.01)
*H03K 17/687* (2006.01)
*H03K 19/20* (2006.01)

(52) U.S. Cl.
CPC ......... *H03K 3/013* (2013.01); *H03K 17/6872* (2013.01); *H03K 19/20* (2013.01)

(58) Field of Classification Search
CPC ..... H03K 3/013; H03K 17/6872; H03K 19/20
USPC .......................................................... 327/291
See application file for complete search history.

(56) References Cited

U.S. PATENT DOCUMENTS

| | | | | |
|---|---|---|---|---|
| 3,855,549 | A * | 12/1974 | Huener | H03K 3/3545 331/116 R |
| 6,828,840 | B2 * | 12/2004 | Ohnishi | H03K 5/08 327/281 |
| 7,176,720 | B1 * | 2/2007 | Prather | H03K 19/018528 330/261 |
| 7,576,580 | B2 * | 8/2009 | Wang | G06F 1/3203 327/161 |
| 7,755,410 | B2 * | 7/2010 | Oh | H03K 5/133 327/291 |
| 10,536,151 | B1 * | 1/2020 | Zhou | G06F 1/06 |
| 2004/0090258 | A1 * | 5/2004 | Ohnishi | H03K 5/1565 327/291 |
| 2013/0106485 | A1 * | 5/2013 | Mukhopadhyay | H03K 19/018507 327/333 |
| 2015/0008970 | A1 * | 1/2015 | Kang | H03K 3/0315 327/291 |

* cited by examiner

*Primary Examiner* — Tomi Skibinski
(74) *Attorney, Agent, or Firm* — Schwegman Lundberg & Woessner, P.A.

(57) ABSTRACT

Embodiments of the invention relate to a clock generation and distribution circuit ("clock circuit") according to various embodiments of the present disclosure. The clock circuit comprises active impedance reduction circuits which improves bandwidth and jitter performance of the clock circuit by lowering the small-signal impedance within the clock circuit. In certain embodiments, an activation element is positioned at a node along a transmission path to cause a reduction in impedance.

20 Claims, 8 Drawing Sheets

300

800

```
┌─────────────────────────────────────────────┐
│ COUPLE AN ACTIVE IMPEDANCE REDUCTION CIRCUIT│
│ THAT COMPRISES A SERIES RESISTOR AND A SET  │──802
│ OF TRANSISTORS, WHICH ARE COUPLED IN A      │
│ FEEDBACK CIRCUIT CONFIGURATION, TO A CLOCK  │
│ CIRCUIT                                     │
└─────────────────────────────────────────────┘
                       │
                       ▼
┌─────────────────────────────────────────────┐
│ FOR A GIVEN FREQUENCY OR FREQUENCY RANGE,   │
│ DECREASE AN IMPEDANCE AT THE NODE TO        │──804
│ DECREASE A JITTER IN THE CLOCK CIRCUIT      │
└─────────────────────────────────────────────┘
```

FIG. 8

CLOCK DISTRIBUTION JITTER REDUCTION SYSTEMS AND METHODS

CROSS REFERENCE TO RELATED PATENT APPLICATIONS

The present application claims priority benefit, under 35 U.S.C. § 119 (e), to and commonly assigned U.S. Provisional Patent Application No. 63/456,993, filed on Apr. 4, 2023, entitled "CLOCK DISTRIBUTION JITTER REDUCTION SYSTEMS AND METHODS," and listing as inventors Rajasekhar Nagulapalli, Wuttichai Lerdsitsomboon and Haichen Liu, which application is herein incorporated by reference as to its entire content. Each reference mentioned in this patent document is incorporated by reference herein in its entirety.

BACKGROUND

A. Technical Field

The present disclosure relates generally to analog or mixed-signal systems. More particularly, the present disclosure relates to active impedance reduction systems and methods for improving jitter performance in clock circuits and related environments.

B. Background

Jitter is a known problem inherent to clock signals, for example, clock signals that are generated by clock circuits used as a timing reference in time-interleaved analog-to-digital ("ADC") or wireline SERDES receiver designs. Clock signals are typically generated by an oscillator circuit, e.g., an LC-oscillator or ring oscillator. It is also known that an LC-VCO that is designed using a low-loss tank and variable capacitors results in superior jitter performance when compared to a ring voltage-controlled oscillator ("VCO") design. Jitter in the clock signal oftentimes leads to unwanted effects, such as bit error rate in a receiver, and the like. Accordingly, what is needed are systems and methods that reduce and, ideally, eliminate clock jitter in clock distribution circuits.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, these figures are not intended to limit the scope of the invention to these particular embodiments. Items in the figures are not to scale.

FIG. 8 is a flowchart of an illustrative process for clock generation and distribution in accordance with various embodiments of the present disclosure.

DETAILED DESCRIPTION OF EMBODIMENTS

Figure 1:
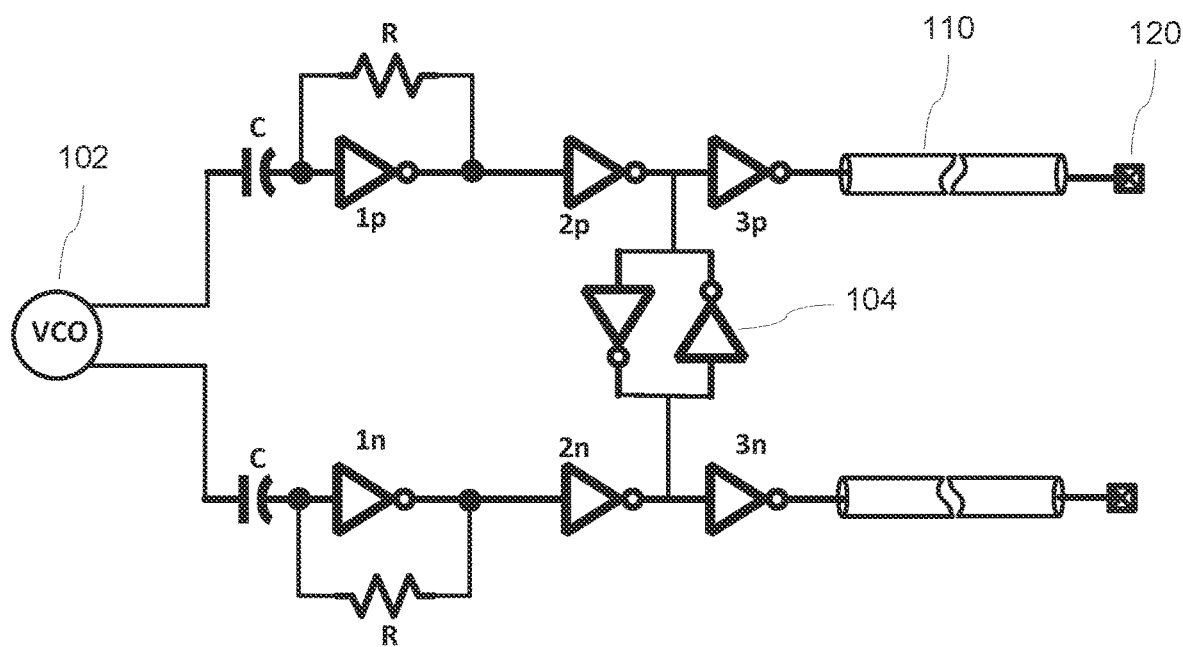
FIG. 1 shows a conventional clock generation and distribution circuit.

In the following description, for purposes of explanation, specific details are set forth to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system/device, or a method on a tangible computer-readable medium.

Components, or modules, shown in diagrams are illustrative of exemplary embodiments of the disclosure and are meant to avoid obscuring the disclosure. It shall be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgement, message, query, etc., may comprise one or more exchanges of information.

Reference in the specification to "one or more embodiments," "preferred embodiment," "an embodiment," "embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," "comprising," and any of their variants shall be understood to be open terms, and any examples or lists of items are provided by way of illustration and shall not be used to limit the scope of this disclosure.

Any headings used herein are for organizational purposes only and shall not be used to limit the scope of the description or the claims. Each reference/document mentioned in this patent document is incorporated by reference herein in its entirety.

Furthermore, it shall be noted that embodiments described herein are presented in the context of clock circuits, but one skilled in the art shall recognize that the teachings of the present disclosure are not limited to such applications and may equally be used in other contexts.

In this document, the term jitter refers to both time-domain representations and corresponding representations (e.g., as phase noise) in the frequency-domain.

FIG. 1 shows a conventional clock generation and distribution circuit. Circuit 100 comprises VCO 102; inverters 1p-3p and complementary inverters 1n-3n, which are typically implemented as CMOS elements; coaxial transmission lines (e.g., 110); and launching pads (e.g., 120). VCO 102 is typically a narrow-band VCO that, in operation, generates a high a speed clock signal (e.g., 12 GHz) that is level-shifted to a $V_{dd}$ level through AC-coupled inverters (denoted as 1p and 1n in FIG. 1). Inverters denoted 2p, 2n and 3p, 3n aid in improving signal quality. Finally, cross-coupled buffers (e.g., 104) serve to reduce or eliminate common-mode noise as the clock signal traverses a relatively long co-axial (or co-planar) transmission line 110 to reach launching end 120.

Total jitter at the receiving end is composed of three components: a VCO contribution, a clock jitter component introduced by the buffers, and a jitter amplification component due to bandwidth limitations.

The main disadvantage of the scheme shown in FIG. 1, is that relatively power-hungry buffers are required at the launching end. This results in increased power consumption. In addition, large size buffers cause a relatively large jitter amplification. Further, return loss caused by reflections at the receiving-end resulting from an impedance mismatch between the mainly resistive transmission line 110 and a capacitive receiver input exacerbates unwanted jitter and edge rate degradation.

Figure 2:
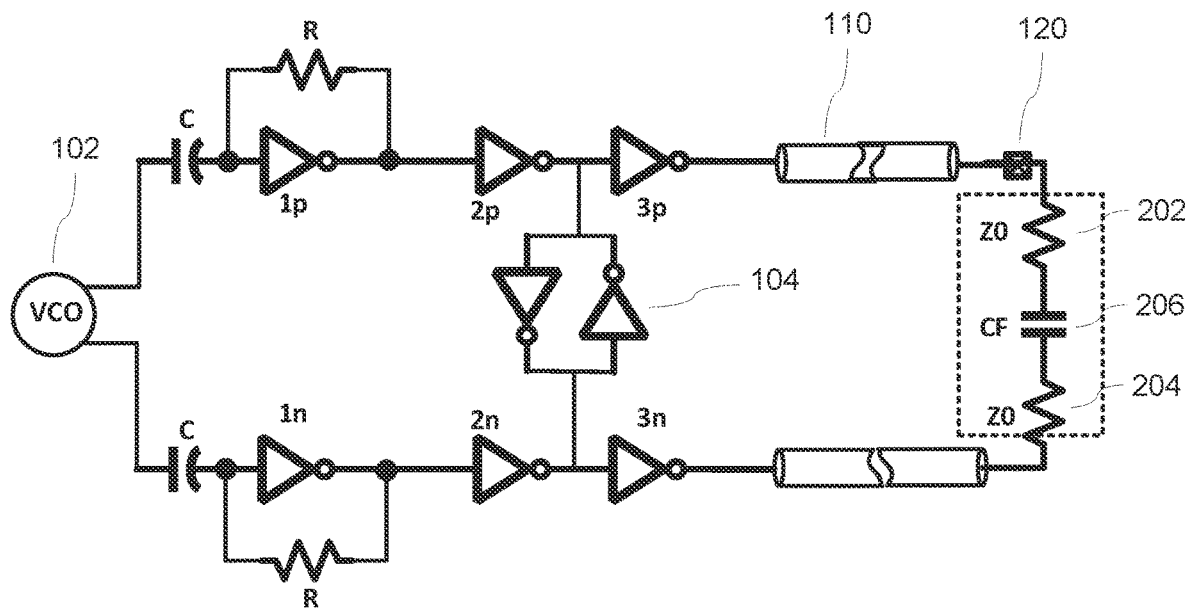
FIG. 2 shows another conventional clock generation and distribution circuit.

FIG. 2 shows another conventional clock generation and distribution circuit. Circuit 200 comprises VCO 102, inverters 1p-3p and complementary inverters 1n-3n, transmission line 110, resistive elements 202, 204, and AC-coupling capacitor 206. As the circuit in FIG. 1, circuit 200 in FIG. 2 uses AC-coupled level shifters. However, unlike the circuit shown in FIG. 1, the receiver-end of circuit 200 is terminated with resistive elements 202 and 204 that each had a resistance value equal to the characteristic impedance $Z_0$ of their corresponding transmission line. Proper termination is a common practice for reducing reflections at the receiver-end that may cause unwanted return losses and other unintended effects on system performance and stability.

Circuit 200 further utilizes capacitor 206 as an AC-coupling capacitor to eliminate DC current flow, which aids in reducing undesirable $I^2R$ losses. While approaches such as those utilized by circuit 200 in FIG. 2 may successfully reduce unwanted reflections at the receiver-end and improve power transfer and bandwidth, the lossy termination negatively impacts clock signal amplitude. Further, neither of the conventional schemes depicted in FIG. 1 or FIG. 2, addresses jitter performance. Random fluctuations may affect the system by introducing uncertainty into the clock signal and, ultimately, result in edge degradation, thus, impacting overall jitter performance of the circuit.

Jitter caused by noise currents and random noise is generated mainly by MOS transistors located within inverters 2p and 2n. Such noise is injected into circuit 200 at the inputs of respective inverters 3p and 3n. For example, noise generated by inverter 2p is a function of noise current multiplied by the output impedance of inverter 2p.

Figure 3:
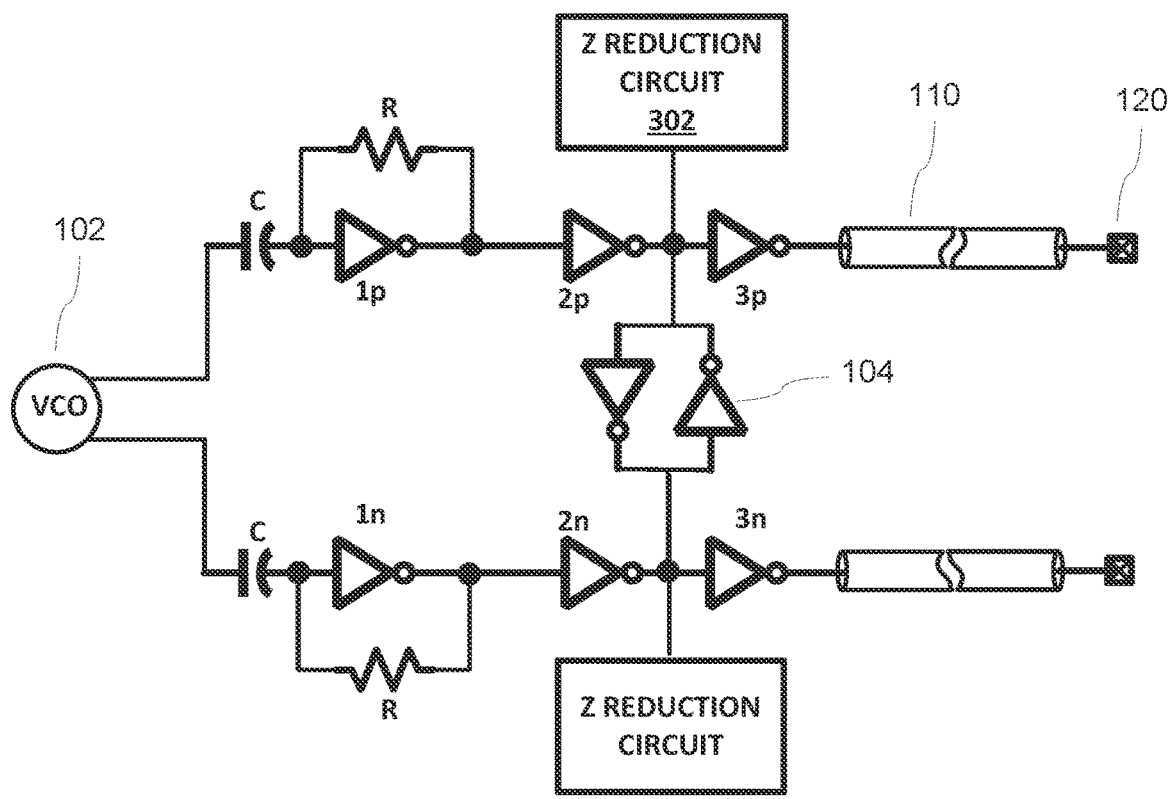
FIG. 3 illustrates a clock generation and distribution circuit according to various embodiments of the present disclosure.

Therefore, in embodiments herein, the frequency-dependent impedance presented to the noise signal at the injection point, i.e., the input of inverter 3p in FIG. 3, is reduced. As a result, the noise voltage, and thus the amount of noise produced at the input of inverter 3p, is successfully reduced, thereby, improving the signal quality of clock signal in terms of jitter and edge rate. In embodiments, the desired impedance reduction may be achieved by a dedicated impedance reduction circuit, such as that shown in FIG. 3.

FIG. 3 illustrates a clock generation and distribution circuit ("clock circuit") according to various embodiments of the present disclosure. For clarity, components similar to those shown in FIG. 2 are labeled in the same manner. For purposes of brevity, a description of their function is not repeated here. One skilled in the art will appreciate that capacitors can be implemented as banks of parallel variable capacitors, and transistors and switches may be implemented using any technology known in the art.

As depicted, clock circuit 300 comprises active impedance reduction circuit 302, which, in embodiments, advantageously improves bandwidth and jitter performance of the distribution circuit 300 by lowering the small-signal impedance at node X (i.e., the impedance seen when looking into the distribution buffer 2p, 2n) at which circuit 302 presents a frequency-dependent impedance reduction according to various embodiments herein.

Figure 4A:
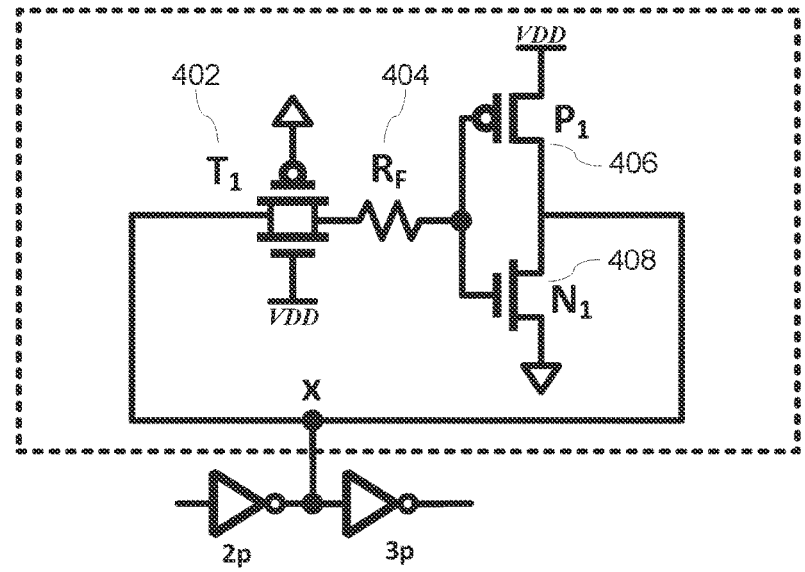
FIG. 4A illustrates an exemplary implementation of an active impedance reduction circuit shown in FIG. 3.

In embodiments, the node at the output of inverter 2p (denoted as node X in FIG. 4A) may comprise an active impedance reduction circuit that utilizes a feedback configuration comprising feedback resistance $R_F$ and an auxiliary clock buffer. FIG. 4A illustrates an exemplary implementation of an active impedance reduction circuit shown in FIG. 3.

In embodiments, circuit 400 comprises an activation element including a power source $V_{DD}$, transmission gate 402 (denoted as $T_1$ in FIG. 4A), which may be formed by P-MOS and N-MOS devices (not shown) and may be implemented by any enable or disable signal; feedback resistor 404 (denoted as $R_F$); and an inverter or auxiliary clock buffer that may be formed, e.g., by transistors 406 and 408 (denoted as $P_1$ and $N_1$, respectively).

In operation, transistors 406 and 408 are powered by a power source, such as $V_{DD}$ depicted in FIG. 4A. It is noted that any additional currents drawn by transistors $P_1$ and $N_1$ may be relatively small in certain embodiments. Therefore, the resulting additional power consumption does not greatly affect overall system performance, including system bandwidth.

In embodiments, to further reduce noise and improve the small signal output impedance, the size or width of one or more of the inverters, e.g., inverters $2_p$ and $3_p$, may be increased. While this will, to a certain degree, decrease the impedance at node X by some amount, it may come at the expense of reduced system bandwidth and increased power consumption, especially since inverters $2_p$ and $3_p$ lie directly in the signal path.

Therefore, in embodiments, for a given frequency or frequency range, for example, at relatively low frequencies, the physical and electrical characteristics of inverters $P_1$, $N_1$, and the resistance value of resistor $R_F$ in circuit 400 may be selected in a manner such as to reduce impedance at node X, i.e., at the output of inverter $2_p$ and input of inverter $3_p$.

Advantageously, the impedance reduction behavior of circuit 400 may cause the amount of noise that is converted at node X to significantly reduce, especially at lower frequencies (e.g., below 10 MHz), where parasitic capacitances of circuit components in circuit 400 are less pronounced. The impedance at node X may be expressed in the frequency domain as:

$$Z_X = \frac{(1 + s \cdot C_{gs} \cdot R_F)}{(gm + s \cdot C_{gs})}$$

The resulting low impedance may, thus, improve the noise amplitude at node X, which may be further optimized by, e.g., adjusting the value of $R_F$ and the physical dimensions of transistors $P_1$ and $N_1$ to obtain a desired impedance (e.g., 300Ω). A typical value for resistor $R_F$ may be 600Ω. Overall, the edge rate may be improved due to fast charging and discharging of the output node, such that the noise current-to-jitter conversion is significantly reduced.

Figure 4B:
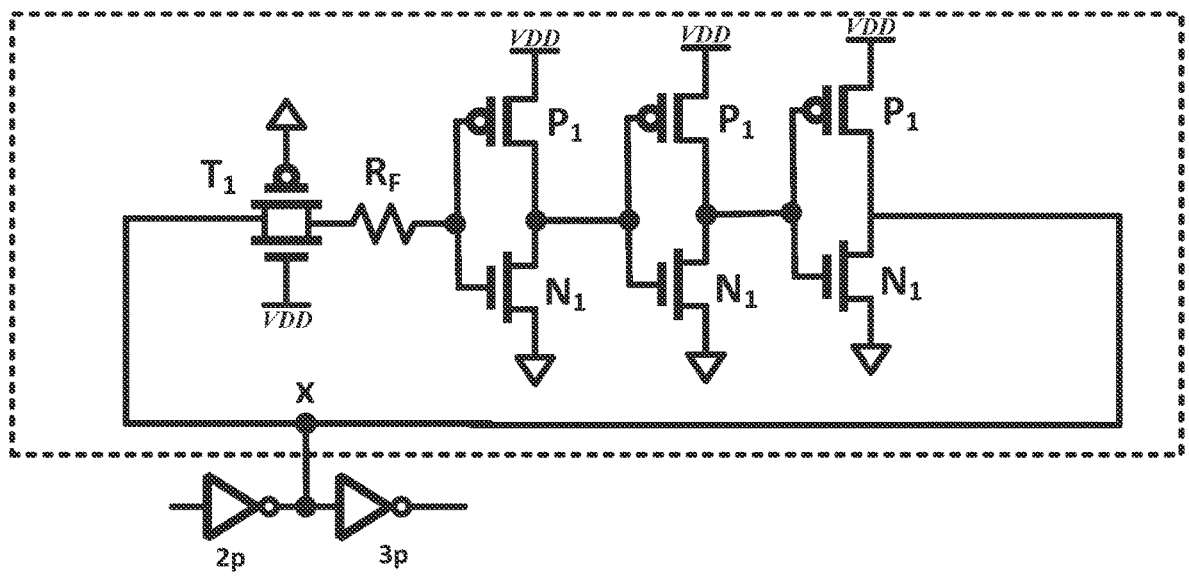
FIG. 4B illustrates an alternative exemplary implementation of the active impedance reduction circuit shown in FIG. 3.

FIG. 4B illustrates an alternative exemplary implementation of the active impedance reduction circuit shown in FIG. 3. Same numerals as in FIG. 4A denote similar elements. As depicted in FIG. 4B, in embodiments, the number of inverters or auxiliary clock buffers in the feedback loop may be increased (here, to three inverters) to achieve a greater reduction in output impedance, which may come at the expense of increased power consumption that may be acceptable in various applications.

It is understood that impedance reduction circuits illustrated in FIG. 4A and FIG. 4B are not limited to the constructional detail shown therein or described in the accompanying text. As those skilled in the art will appreciate, suitable circuit components may be designed using additional of other discrete or distributed circuit components. Further, such opponents may be combined in various configurations to achieve the objectives of the present disclosure.

Figure 5:
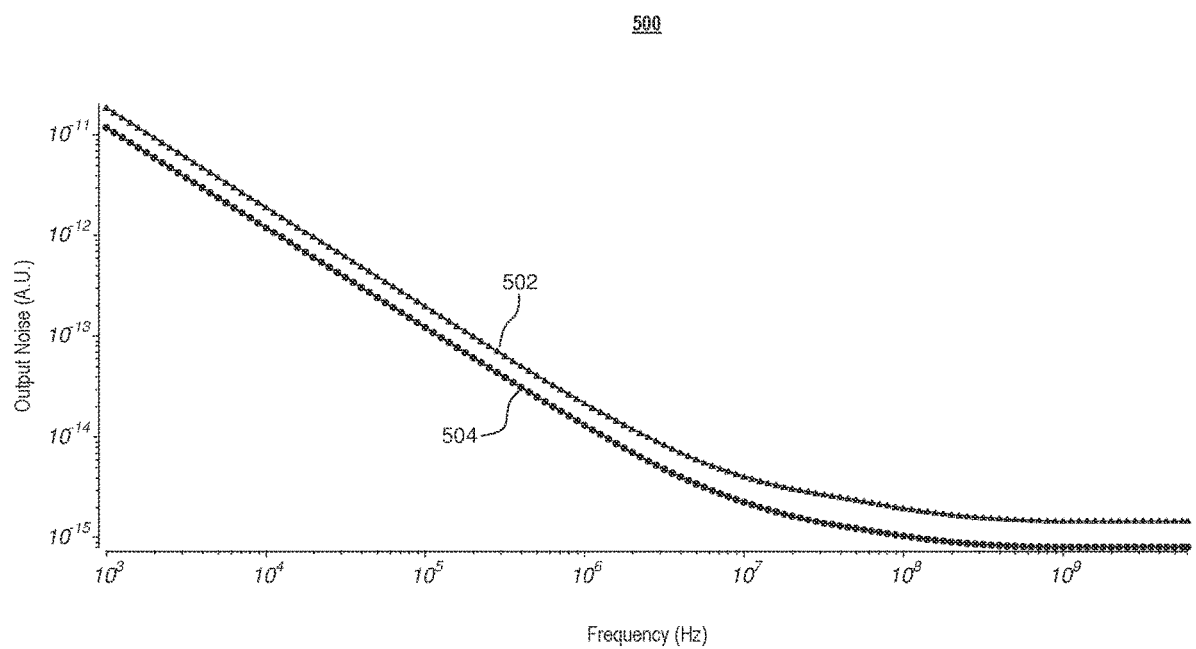
FIG. 5 is a comparison plot that illustrates the effects of the impedance reduction behavior of the circuit in FIG. 4A on phase noise.

FIG. 5 is a comparison plot 500 that illustrates the effects of the impedance reduction behavior of the circuit in FIG. 4A on phase noise. Plot 502 in FIG. 5 shows phase noise at the output of the transmission line for a conventional method, whereas plot 504 illustrates phase noise for systems and methods according to various embodiments of the present disclosure.

As depicted in FIG. 5, plot 504 exhibits a 2.2 dB improvement over plot 502. It is noted that the experiments and results herein are provided by way of illustration and were performed under specific conditions using a specific embodiment or embodiments. Accordingly, neither these experiments nor their results shall be used to limit the scope of the disclosure of the current patent document.

Figure 6:
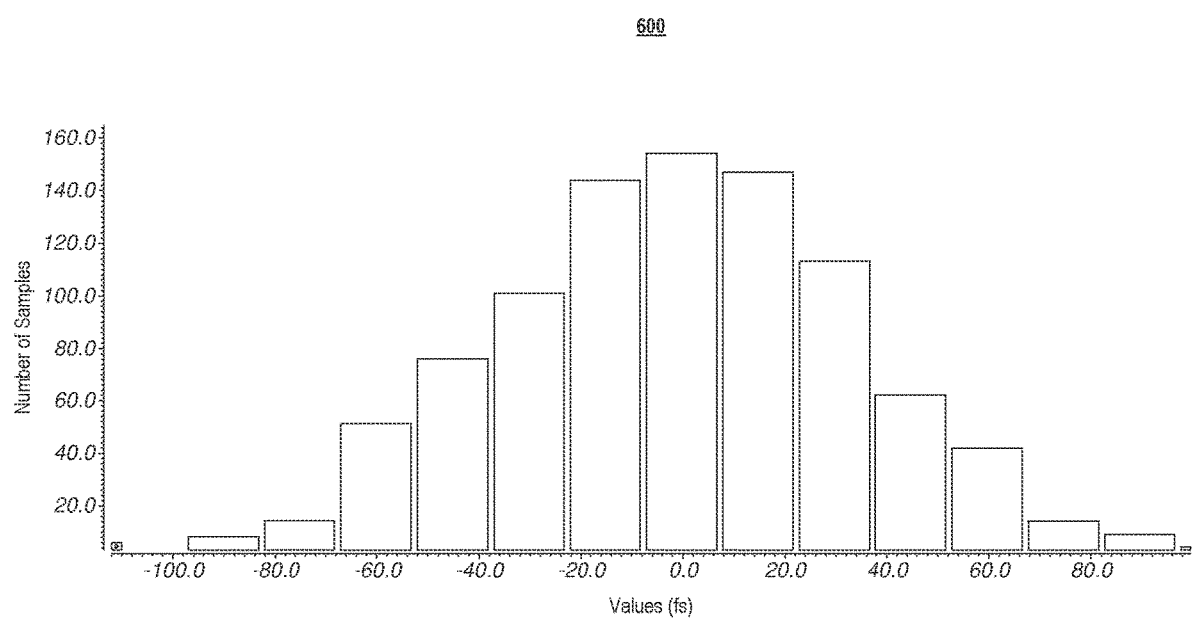
FIG. 6 shows simulation results for jitter for a conventional clock distribution method.
Figure 7:
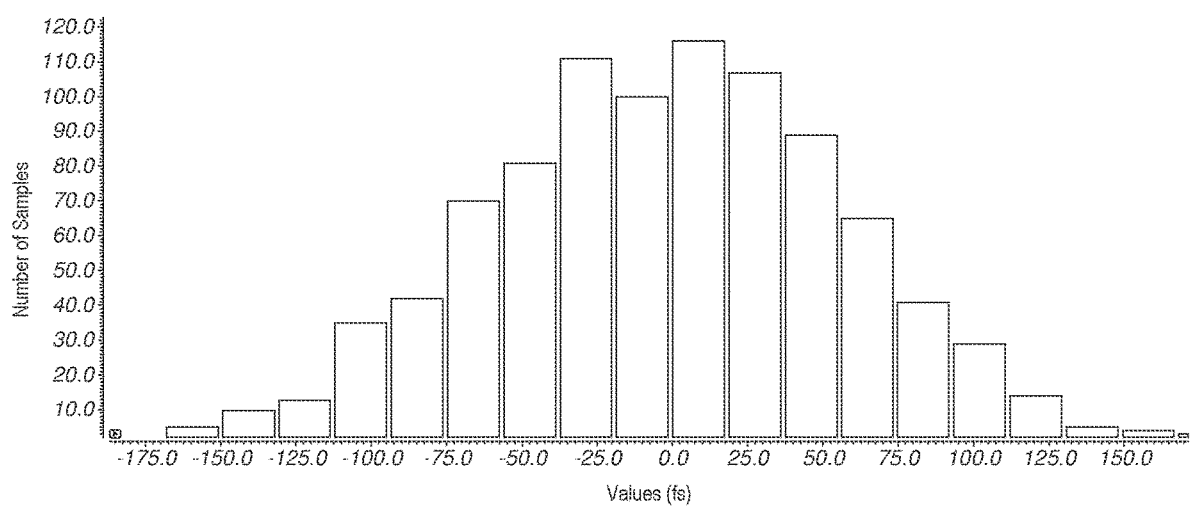
FIG. 7 shows an exemplary jitter histogram for systems and method according to various embodiments herein.

FIG. 6 shows simulation results for jitter for a conventional clock distribution method. Histogram 600 demonstrates a sigma of 31 fs, whereas in FIG. 7, an exemplary jitter histogram 700 for systems and method according to various embodiments herein, demonstrates a sigma of 50.5 fs. Overall, the experimental results in FIG. 7 confirm that systems and method according to various embodiments herein achieve demonstrably better results compared to existing designs.

FIG. 8 is a flowchart of an illustrative process for clock generation and distribution accordance with various embodiments of the present disclosure. In embodiments, process 800 may begin at step 802 when, at a node, a feedback circuit, which comprises a series resistor and a set of transistors, is coupled to a clock circuit.

At step 804, values selected for the series resistor and the set of transistors may cause the impedance at the node to decrease a jitter in the clock circuit. One skilled in the art shall recognize that: (1) certain steps may optionally be performed; (2) steps may not be limited to the specific order set forth herein; (3) certain steps may be performed in different orders; and (4) certain steps may be done concurrently.

One skilled in the art will further recognize no computing system or programming language is critical to the practice of the present disclosure. One skilled in the art will also recognize that a number of the elements described above may be physically and/or functionally separated into modules and/or sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A clock generation and distribution method comprising:
    coupling an active impedance reduction circuit at a node, the active impedance reduction circuit comprising a series resistor and a set of transistors coupled to the node in a clock circuit, the series resistor and the set of transistors being coupled in a feedback configuration; and
    for a given frequency or frequency range, decreasing an impedance at the node to decrease a jitter in the clock circuit.

2. The method of claim 1 further comprising selecting a value for the series resistor and at least one of a physical or electrical characteristic of the set of transistors such as to cause the impedance at the node to decrease.

3. The method of claim 1, wherein the clock circuit comprises a set of inverters in a signal path, and the active impedance reduction circuit is not located in the signal path.

4. The method of claim 1 wherein the set of transistors is comprised in an auxiliary clock buffer.

5. The method of claim 1 further comprising using at least one of an enable signal and a transmission gate to activate the active impedance reduction circuit.

6. The method of claim 5 wherein the transmission gate comprises P-MOS and N-MOS elements.

7. The method of claim 1 wherein decreasing the jitter comprises decreasing noise at the output of an inverter that is coupled to the node.

8. An active impedance reduction circuit comprising:
    an auxiliary clock buffer;
    a resistive element that is coupled in series with the auxiliary clock buffer; and
    an activation element that together with the auxiliary clock buffer and the resistive element is coupled in a feedback configuration, that activation element enabling the active impedance reduction circuit to be coupled to a node in a clock circuit to reduce an impedance of the node, thereby, reducing a jitter in the clock circuit.

9. The circuit of claim 8 where the jitter is reduced for a given frequency or frequency range.

10. The circuit of claim 8 wherein the activation element comprises a voltage source and a transmission gate.

11. The circuit of claim 10 wherein the transmission gate comprises at least one of a P-MOS device and an N-MOS device.

12. The circuit of claim 8 wherein the auxiliary clock buffer and the resistive element result in a reduction of impedance at a node between two inverters within the clock circuit.

13. The circuit of claim 12 wherein the auxiliary clock buffer comprises a single transmission gate.

14. The circuit of claim 13 wherein the single transmission gate results in an impedance reduction at a node between two inverters within the clock circuit.

15. The circuit of claim 12 wherein the auxiliary clock buffer comprises a plurality of transmission gates.

16. The circuit of claim 15 wherein the plurality of transmission gates results in an impedance reduction at a node between two inverters within the clock circuit.

17. The circuit of claim 12 wherein the reduction of impedance at the node between the two inverters is represented by $$Z_X = \frac{(1 + s \cdot C_{gs} R_F)}{(gm + s \cdot C_{gs})}.$$

18. A clock circuit comprising:
a voltage controlled oscillator;
a first plurality of inverters coupled to the voltage-controlled oscillator, the first plurality of inverters configured to reduce common-mode noise on a first clock signal;
a second plurality of inverters coupled to the voltage-controlled oscillator, the second plurality of inverters configured to reduce common-mode noise on a second clock signal;
a first active impedance circuit coupled between a first inverter and second inverter within the first plurality of inverters, the first active impedance circuit configured to reduce impedance at a first node between the first and second inverters; and
a second active impedance circuit coupled between a third inverter and a third inverter with the second plurality of inverters, the second active impedance circuit configured to reduce impedance at a second node between the third and fourth inverters.

19. The clock circuit of claim 18 wherein the first plurality of inverters is coupled to a first transmission line and the second plurality of inverters is coupled to a second transmission line.

20. The clock circuit of claim 19 wherein a first launching pad is coupled to the first transmission line and a second launching pad is coupled to the second transmission line.

* * * * *